(12) United States Patent
Mukai et al.

(10) Patent No.: US 12,369,424 B2
(45) Date of Patent: Jul. 22, 2025

(54) COATING OF SOLAR PANEL BACKSIDE

(71) Applicant: Henkel AG & Co. KGaA, Duesseldorf (DE)

(72) Inventors: Barbara Mukai, Erlangen (DE); Michael Steinbach, Bobingen (DE); Josef Mitterbauer, Bogen (DE)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 18/312,649

(22) Filed: May 5, 2023

(65) Prior Publication Data

US 2023/0275179 A1 Aug. 31, 2023

Related U.S. Application Data

(63) Continuation of application No. PCT/EP2021/081234, filed on Nov. 10, 2021.

(30) Foreign Application Priority Data

Nov. 13, 2020 (EP) .................................. 20207599

(51) Int. Cl.
*H10F 71/00* (2025.01)
*C09D 4/00* (2006.01)
*H10F 19/80* (2025.01)
*H10F 19/85* (2025.01)

(52) U.S. Cl.
CPC .............. *H10F 71/00* (2025.01); *C09D 4/00* (2013.01); *H10F 19/804* (2025.01); *H10F 19/85* (2025.01)

(58) Field of Classification Search
CPC ..... H01L 31/0481; H01L 31/049; C09D 4/00; H10F 19/804; H10F 19/85; H10F 71/00
See application file for complete search history.

(56) References Cited

U.S. PATENT DOCUMENTS

| | | | |
|---|---|---|---|
| 7,319,128 B2 | 1/2008 | Ziche et al. | |
| 8,101,704 B2 | 1/2012 | Baumann et al. | |
| 8,907,027 B2 | 12/2014 | Stanjek et al. | |
| 2006/0135728 A1* | 6/2006 | Peerlings | B32B 17/10018 528/59 |
| 2012/0094131 A1* | 4/2012 | Takanashi | C08J 7/048 428/421 |
| 2012/0329897 A1* | 12/2012 | True | C09J 175/16 522/28 |
| 2013/0005071 A1* | 1/2013 | Hiraike | C08L 23/26 438/73 |
| 2013/0167928 A1* | 7/2013 | Hiraike | C09J 7/245 428/355 R |
| 2015/0000735 A1* | 1/2015 | Ketola | C09D 183/14 136/256 |
| 2015/0221797 A1* | 8/2015 | Klun | H10F 19/804 136/259 |
| 2020/0313015 A1 | 10/2020 | Harder et al. | |
| 2023/0275179 A1* | 8/2023 | Mukai | C09D 4/00 136/244 |

FOREIGN PATENT DOCUMENTS

| | | | | |
|---|---|---|---|---|
| CN | 109517534 A | 3/2019 | | |
| CN | 110016283 A | 7/2019 | | |
| CN | 110607131 A | 12/2019 | | |
| EP | 1535940 B1 | 6/2007 | | |
| EP | 1896523 B1 | 10/2010 | | |
| WO | 2013026654 A1 | 2/2013 | | |
| WO | WO-2019080971 A1 * | 5/2019 | ......... | H01L 31/0481 |

OTHER PUBLICATIONS

International Search Report for International PCT Patent Application No. PCT/EP2021/081234 dated Jan. 27, 2022.

* cited by examiner

*Primary Examiner* — Golam Mowla
(74) *Attorney, Agent, or Firm* — Mary K. Cameron

(57) ABSTRACT

The present invention is directed to a method of repairing a solar panel backside, to a repaired solar panel backside thusly obtainable, and to the use of a curable composition for the repairing of a solar panel backside comprising at least one site in need of repair.

12 Claims, No Drawings

COATING OF SOLAR PANEL BACKSIDE

The present invention is directed to a method of repairing a solar panel backside, to a repaired solar panel backside thusly obtainable, and to the use of a curable composition for the repairing of a solar panel backside comprising at least one site in need of repair.

The solar panel backboard is located on the back face of a solar panel. It plays a role in protecting and supporting the cells in the module and has robust insulation and water resistance. However, after the backboard of a solar module is used outdoors for a period of time, the backboard will suffer from gradual aging and cracking phenomena such as yellowing, pinholes, chalking, micro-cracking and cracking, and therefore cannot meet the safety requirements of the module during operation. Moreover, during the transportation and installation of the solar module, part of the backboard of the module might be damaged and scratched, and safety failure and function failure can also be caused upon the operation of the module for those reasons.

Up to now, suitable repairing methods intended for the damaged part of the solar backboard have not been found, only the method of replacing the damaged module as a whole can be used, which method can only achieve the replacement of a small number of modules and results in extremely high cost for replacement in a large batch, and the used modules are difficult to recover and also prone to causing environmental pollution. In view of this background, it is of great significance to develop a method, which can be applied on site, is environmentally friendly and waste-free, has low cost, and allows for normal operation of damaged modules within the guarantee period.

There is a need, therefore, for a method of repairing solar panel backside, i.e., solar backboard, that is fast, economically effective and flexible enough for the repairing of differing types of defects, such as scratches, holes, cracks, and micro-cracks.

This need is met by the object of the present invention, as provided herein is a method of repairing a solar panel backside, which overcomes the aforementioned problems of state-of-the-art methods of repairing in being fast and easy to handle, economically effective and highly flexible.

The method of the present invention can be utilized for all kinds of solar panel, which have a supportive and/or protective backside (i.e., a solar backboard).

In one aspect, the present invention thus relates to a method of repairing a solar panel backside, the method comprising the steps of:
  i) applying at least one curable composition onto at least part of the solar panel backside, said part of the solar backside comprising at least one site in need of repairing; and
  ii) curing said curable composition to obtain a repaired solar panel backside, characterized in that the at least one curable composition is a moisture curable composition.

In another aspect, the present invention relates to a repaired solar panel backside obtainable in a method as herein described.

In a further aspect, the present invention relates to the use of a curable composition for the repairing of a solar panel backside comprising at least one site in need of repair.

Embodiments of the present invention are described below, but the present invention is not limited thereto. It should be recognized that these embodiments are merely illustrative of the principles of the present invention. Numerous modifications and adaptations will be readily apparent to those of skill in the art without departing from the scope of the invention.

"One or more", as used herein, relates to at least one and comprises 1, 2, 3, 4, 5, 6, 7, 8, 9 or more of the referenced species. Similarly, "at least one" means one or more, i.e., 1, 2, 3, 4, 5, 6, 7, 8, 9 or more.

In the present specification, the terms "a" and "an" and "at least one" are the same as the term "one or more" and can be employed interchangeably.

"About", as used herein in relation to a numerical value, means said value ±10%, preferably ±5%.

The term "liquid", as used herein, refers to compounds or mixtures of compounds that are flowable, pourable and/or sprayable at room temperature (about 15° C. to about 25° C.).

Provided herein is a method of repairing a solar panel backside, said method comprising the steps of i) applying at least one curable composition onto at least part of the solar panel backside, said part of the solar panel backside comprising at least one site in need of repairing; and ii) curing said curable composition to obtain a repaired solar panel backside.

In the context of the present invention, a solar panel backside comprising at least one site in need of repairing is a solar panel backside, which is in some way damaged. A damage of a solar panel backside may include, but is not limited to blistering, a crack, a micro-crack, a scratch, a fissure, a hole, a rupture, a tear and a chink in the solar panel backside. More specifically, in the context of the present invention, any such damage is present in the solar panel backboard. Furthermore, the damage present in a solar panel backside may constitute a conglomerate of any of the aforementioned kinds of damage that can typically occur in a solar panel backside, such as on the outer surface of the solar panel backside. Accordingly, a damaged solar panel backside may comprise one or more of the aforementioned kinds of damage. Furthermore, a damaged solar panel backside may comprise one or more distinct sites in need of repairing, such as, for instance but without limitation, a series of scratches at one distinct portion of the outer surface of the solar panel backboard and, for instance but without limitation, a series of cracks and/or micro-cracks at another distinct portion of the outer surface of the solar panel backboard. Accordingly, in various embodiments, the site of the solar panel backside in need of repairing is selected from one or more of a crack, a micro-crack, a scratch, a fissure, a hole, a rupture, a tear and a chink in the solar panel backside.

So as to allow for homogenous application of the at least one curable composition according to step i) (and potential additional steps of application as will be described and defined herein below), thorough curing of the thusly applied curable composition as well as sufficient adhesion of the eventually cured composition, the outer surface of the solar panel backside may be cleaned prior to step i) (and potential additional steps of application as will be described and defined herein below) according to the method of the present invention. Said cleaning may comprise the cleaning of the entire outer surface of the solar panel backside, i.e. the outer surface or the solar panel backside, i.e. the outer surface of the solar panel backboard, or may include only the cleaning of certain parts of the solar panel backside, i.e. certain parts of the outer surface of the solar panel backside, such as a site in need or repairing, as herein defined above, and/or a perimeter surrounding said site in need of repairing. Thus, according to various embodiments, the method herein described comprises a further step of cleaning at least part of the solar backside comprising at least one site in need of repairing prior to applying at least one curable composition according to step i).

The cleaning of the solar panel backside, as herein described above, may include manual and/or machine-aided cleaning of (parts of) the solar panel backside, i.e., the outer surface of the solar panel backside, i.e. the outer surface of the solar panel backboard. For instance but without limitation, manual cleaning may encompass the wiping- and/or brushing-off of any liquid and/or particulate foreign matter, i.e. any matter present on the outer surface of the solar panel backside that is not an inherent part of the outer surface of the solar panel backside, such as any kind of soiling of the solar panel backside of environmental origin, such as (rain) water, dust, pollen, etc. as well as mixtures thereof, but also, for instance, dusty residue from the solar panel itself, which sometimes occurs due to degradation of the filmic backside, possibly dusty residues comprising or consisting of filler materials, such as titanium dioxide, chalk, calciumcarbonate, etc. Foreign matter to be cleaned off of the solar panel backside may further include greasy residues, which, for instance but without limitation, may be caused by handling of the solar panel, i.e., touching of the solar panel backside, for instance with bare hands. In addition to or instead of manual cleaning, the cleaning may be machine-aided and may, for instance but without limitation, encompass the blowing-off of any foreign matter to be cleaned off the outer surface of the solar panel backside, as herein defined above.

In various embodiments, the cleaning, as herein defined above, may further encompass the use of one or more cleaning aids, such as a solvent or a detergent, optionally in combination with water. Any such products suitable for employment in the herein defined context are well known in the art and will be readily recognized by the person skilled in the field. Solvents suitable for employment in the herein defined context generally include polar and non-polar solvents. Non-limiting Examples of polar solvents include polar protic solvents such as ammonia, acetic acid, n-Butanol, isopropyl alcohol, n-propanol, ethanol and methanol. Non-limiting examples of polar aprotic solvents include dichloromethane, ethyl acetate, tetrahydrofuran, acetone, and dimethylformamide. Non-limiting examples of non-polar solvents include pentane, cyclopentane, hexane, cyclohexane, benzene, toluene, diethyl ether, and chloroform. Suitable for application in the context of the present invention are also mixtures of solvents, such as mixtures of alcohols, such as a mixture of butanol and ethanol. Non-limiting examples of a commercially available cleaning solutions suitable for application in the context of the present invention are Loctite SF 7063™ and BONDERITE C-IC 144, BONDERITE C-AK 5800, and Teroson SB 450 all available from Henkel; Teroson PU 8550 available from Henkel; and HERWETEC Schukolin® cleaning solution for photovoltaic and solar cell modules available from Herwetec.

The cleaning of the solar panel backside, as herein defined above, may include a single cleaning step or multiple cleaning steps, wherein in each cleaning step different cleaning methods and/or products may be applied.

The at least one curable composition applied to the solar panel backside, i.e. the outer surface of the solar panel backside, i.e. the outer surface of the solar panel backboard, according to step i) of the herein described method, may be applied manually, for instance directly from the container, such as a tube, a cartridge, a barrel, a pail, a hobbock etc. holding said curable composition, optionally by means of a dispensing aid, such as an appropriately formed and dimensioned nozzle to be fitted onto the opening of said container, such as a tube, so as to allow for easy handling and application of said curable composition. The application and or spreading of said curable composition may be further facilitated and aided by means of a spatula or brush or roller or other appliance or tool or a combination thereof. Furthermore, application of the at least one curable composition according to step i) of the herein defined method may be machine-aided and may, for instance but without limitation, encompass the use of a dispensing gun, such as a pneumatic dispensing gun, an example of which is a spraying gun. Any appliance and/or tool may be selected to fit the particular dispensing and application needs. For instance, if the damage to be repaired extends across a considerable portion of the solar panel backside, i.e., the outer surface of the solar panel backside, widespread application of the at least one curable composition according to step i) of the method of the present invention might be wished for. In such cases, the use of a spraying gun, such as a pneumatic spraying gun, may be advantageous so as to allow for relatively easy, quick, material and time efficient application of the at least one curable composition onto the damaged solar panel backside, such as at least a part of the solar panel backside comprising at least one site in need of repair, as herein defined above. In cases wherein the damage to be repaired is a small-area damage, such as a single small hole, manual application of the at least one curable composition according to step i) may be preferably, for instance by means of an appropriately formed and dimensioned dispensing nozzle fitted on the opening end of a tube or syringe containing the at least one curable composition to be applied so as to avoid excessive waste of material as best as possible. Of particular import is the thorough applying and spreading of the curable composition onto and/or into the damaged site itself as well as optionally further onto a certain perimeter surrounding said site, such as the area around a hole or a scratch. The curable composition may be applied onto the damaged site, i.e., a site in need of repair, such as a hole in the solar panel backside, so as to only cover said site, such as a hole in the solar panel backside. Alternatively, any form of undesired, i.e., to be repaired, depression may be partly, almost completely or completely filled with said curable composition. Depending on the type of damage, one may choose to use for instance a pointed dispensing appliance, such as a syringe with a pointed outlet, so as to allow for well-aimed dispensing into any such depression to be partly or completely filled, or may choose to use for instance a spatula or roller in case application of a certain amount of pressure appears necessary or called for.

Naturally, the preferred type of application also depends on the type of curable composition used. If, for instance, said curable composition to be applied according to step i) of the herein described method is a one-component (1K) curable composition, the means of application may differ from those generally and suitably employed in the case of a two-component (2K) curable composition to be applied according to step i). For a 2K curable composition, for instance, the pre-mixing of both components may be necessary prior to application, such as the pre-mixing of both components in a static mixer, such as a static mixer in the form of a syringe. It will be recognized by those skilled in the art that the exact method of application of the at least one curable composition according to step i) of the herein described method is not a limiting factor, i.e. limiting characteristic, of the present invention, i.e. the herein described methods, uses and articles, and that the exact method of application according to step i) may be sensibly chosen, adapted if necessary and purposefully brought into practice to meet the particular needs a given situation presents itself with.

Another factor to be considered in choosing the best suited type of application and/or spreading method, appliance or tool is the viscosity of the at least one curable composition to be applied according to step i) of the herein described method. Advantageously, said at least one curable composition is flowable enough so that application and spreading thereof is easy enough and flowing of said composition into any depression in the outer surface of the solar panel backside, such as into a crack or hole in the outer surface of the solar panel backside, is allowed for or at least the filling of any such depression may be accomplished with reasonable effort. On the other hand, excessive dripping of the curable composition is undesired, for which reason the viscosity of said curable composition should be high enough so as to prevent flowing-off of said composition from the site of the solar panel backside it has been applied onto. According to various, the viscosity of the at least one curable composition to be applied according to step i) of the herein described method lies in the range of about 10 to about 1,000,000 mPas, more preferably about 10 to about 500,000 mPas, such as in the range of about 100 to about 20,000 mPas, most preferably in the range of about 10 to about 1,000 mPas, such as bout 10, 20, 30, 40, 50, 60, 70, 80, 90, 100, 110, 120, 130, 140, 150, 160, 170, 180, 190, 200, 250, 300, 350, 400, 450, 500, 550, 600, 650, 700, 750, 800, 850, 900, 950 or 1,000 mPas.

According to various embodiments, user-friendly application may be further assisted if the curable composition to be applied is carefully heated prior to application thereof. Carful heating, in this context, may, for instance but without limitation, be the heating of said curable composition to a temperature in the range of about 25 to about 80° C., more preferably about 30 to about 60° C., such as about 35, 40, 45, 50 or 55° C. In various embodiments, heating of the curable composition, as herein described and defined, may lower the viscosity of the curable composition, thus allowing for easier discharge from the container holding it and/or easier application thereof onto the outer surface of the solar panel backside to be repaired and/or easier spreading thereof once applied onto the outer surface of said solar panel backside, so as to obtain an evenly spread layer of curable composition, said layer having a desired thickness. Naturally, the particular type of curable composition used should be considered in this context; in other words, heating of a heat curable composition prior to its application is generally not recommended.

According to various embodiments of the present invention, the application of the at least one curable composition according to step i) of the herein described method encompasses the use of one or more appliances or tools for applications, preferably selected from the group consisting of a spatula, a brush, a roller, a reel, a knife, a spoon, a scaler, a syringe, a dispensing gun, such as mechanic or a pneumatic dispensing gun, such as a pneumatic spraying gun, and combinations of the aforementioned.

The curable composition, as herein defined and described, may be applied at a temperature of the surrounding environment that is not particularly limited. For instance, but without limitation, said temperature may be within the range of about −20° C. to about +80° C., for instance within the range of about −10° C. to about +50° C., such as about −10, −8, −5, −3, −1, 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 35, 40, 45 or 50° C. According to various embodiments, it is preferably that the curable composition be liquid at a given surrounding temperature. As previously described, application of a curable composition may be made more user-friendly and overall easier if the viscosity of said composition is modified, for instance by carefully heating and/or diluting said composition with a suitable solvent or diluent.

In the context of the present invention, it is preferable that the at least one curable composition to be applied according to step i) as herein described is selected from the group consisting of moisture curable compositions.

The term "moisture curable composition" is well known in the art and generally refers to any curable composition that may be cured upon contact with moisture, wherein contact with moisture may refer to ambient moisture, i.e., humidity, or to certain amounts of water present in the curable composition itself, such as in the case of a 2K moisture curable composition, wherein one component comprises, for instance, water. Therefore, depending on the particular type of curable composition used in step i) of the herein described method, the curing conditions according to step ii) of the herein described method are purposefully selected and the curing realized so as to obtain a repaired solar panel backside. According to various embodiments, said at least one curable composition is a moisture curable composition.

The at least one curable composition to be applied according to step i) of the herein described method may be a one-component (1K) or a two-component (2K) composition.

More particularly, the at least one curable composition to be applied to the solar panel backside according to step i) of the herein described method, as described and defined above, may be, according to various embodiments, selected from the group consisting of modified silane (MS) type resin compositions, i.e., silane-modified polymer (SMP) compositions, including α-silane and γ-silane type curable resin compositions. MS polymers generally refer to silane-modified polyether polyols, silane modified polyacrylates, silane-modified polyurethanes, and silane-modified polyether-polyurethanes, i.e., polymers featuring hydrolysable silyl groups at the terminal ends of the respective prepolymer main chain. Both 1K and 2K curable MS type polymer compositions are generally known in the art.

As a non-limiting example, according to various embodiments, a curable composition to be applied according to step i) of the herein described method may be a composition comprising at least one compound of Formula (I)

$$Y-[(CR^1_2)_b-SiR_a(OR^2)_{3-a}]_x \quad (I)$$

wherein, in Formula (I),

Y denotes an x-valent polymer radical bonded via nitrogen, oxygen, sulfur or carbon, R is independently selected from a monovalent, optionally substituted, SiC-bonded hydrocarbon radical, $R^1$ is independently selected from hydrogen or a monovalent, optionally substituted hydrocarbon radical which may be attached to the carbon atom via nitrogen, phosphorus, oxygen, sulfur or carbonyl group, $R^2$ is independently selected from hydrogen or a monovalent, optionally substituted hydrocarbon radical, x is an integer from 1 to 10, preferably 1, 2 or 3, especially preferably 1 or 2 a is independently selected from 0, 1 and 2, preferably 0 and 1, and b is independently selected from an integer from 1 to 10, preferably 1, 3 and 4, particularly preferably 1 and 3, in particular 1.

Examples of radicals R are alkyl radicals, such as the methyl, ethyl, n-propyl, iso-propyl, 1-n-butyl, 2-n-butyl, iso-butyl, tert. pentyl radical; hexyl radicals, such as the n-hexyl radical; heptyl radicals, such as the n-heptyl radical; octyl radicals, such as the n-octyl radical, iso-octyl radicals and the 2,2,-trimethylpentyl radical; nonyl radicals, such as the n-nonyl radical; decyl radicals, such as the n-decyl radical; dodecyl radicals, such as the n-dodecyl radical; octadecyl radicals, such as the n-octadecyl radical; cycloalkyl radicals, such as cyclopentyl, cyclohexyl, cycloheptyl and methylcyclohexyl radicals; alkenyl radicals, such as vinyl, 1-propenyl and 2-propenyl radicals; aryl radicals, such as the phenyl, 2-propenyl and 2-propenyl radicals; and phenyl-, naphthyl, anthryl and phenanthryl radicals; alkaryl radicals, such as o-, m-, p-tolyl radicals, xylyl radicals and ethylphenyl radicals; and aralkyl radicals, such as the benzyl radical, the a~ and the α-phenylethyl radical.

Examples of substituted radicals R are haloalkyl radicals such as the 3,3,3-trifluoro-n-propyl radical, the 2,2,2,2',2',2',2'-hexafluoroisopropyl radical and the heptafluoroxsopropyl radical, and haloaryl radicals such as the o-, m-, and p-chlorophenyl radicals. The R radical is preferably a monovalent hydrocarbon radical having 1 to 6 carbon atoms which is optionally substituted by halogen atoms, particularly preferably an alkyl radical having 1 or 2 carbon atoms, in particular methyl radical.

Examples of radicals $R^1$ are hydrogen atoms, the radicals indicated for R and optionally substituted hydrocarbon radicals bonded to the carbon atom via nitrogen, phosphorus, oxygen, sulfur, carbon or carbonyl groups.

Preferably, $R^1$ is hydrogen and hydrocarbon radicals with 1 to 20 carbon atoms, especially hydrogen.

Examples of $R^2$ are hydrogen or the examples given for R.

Preferably, the $R^2$ radicals are hydrogen or alkyl radicals containing 1 to 10 carbon atoms, optionally substituted by halogen atoms, particularly preferably alkyl radicals containing 1 to 4 carbon atoms, in particular the methyl and ethyl radicals.

For the purposes of the present invention, polymers on which the polymer residue Y is based, are all polymers in which at least 50%, preferably at least 70%, particularly preferably at least 90%, of all bonds in the main chain are carbon-carbon, carbon-nitrogen or carbon-oxygen bonds. Polymer residues Y are preferably organic polymer residues which are polyoxyalkylenes, such as polyoxyethylene, polyoxypropylene, polyoxybutylene, polyoxytetramethylene, polyoxyethylene-polyoxypropylene copolymer and polyoxypropylene-polyoxybutylene copolymer as polymer chain; hydrocarbon polymers, such as polyisobutylene, polyethylene or polypropylene and copolymers of polyisobutylene with isoprene; polyisoprenes; polyurethanes; polyesters; polyamides; polyacrylates; polymetacrylates ; and polycarbonates and which preferably are bonded to each group —[(CR$^1_2$)$_b$—SiR$_a$(OR$^2$)$_{3-a}$]$_x$ via —O—C(=O)—NH—, —NH—C(=O)O—, —NH—C(=O)—NH—, —NR'—C(=O)—NH—, NH—C(=O)—NR'—, —NH—C(=O)—, —C(=O)—NH—, —C(=O)—O—, —O—C(=O)—, —O—C(=O)—O—, —S—C(=O)—NH—, —NH—C(=O)—S—, —C(=O)—S—, —S—C(=O)—, —S—C(=O)—S—, —C(—O)—, —S—, —O— oder —NR'—, wherein R' may be the same or different and has a meaning specified for R, or represents a group —CH(COOR")—CH$_2$—COOR", wherein R" can be the same or different and has the meaning specified for R. Examples of radicals R' include cyclohexyl-, cyclopentyl, n- and iso-propyl-, n-, iso- and t-butyl, the various sterioisomers of the pentyl radical, hexyl radical or heptyl radical and the phenyl radical. R' is preferably a group —CH(COOR")—CH$_2$—COOR" or an optionally substituted hydrocarbon radical having 1 to 20 carbon atoms, particularly preferably a linear, branched or cyclic alkyl group having 1 to 20 carbon atoms or an aryl group having 6 to 20 carbon atoms, which is optionally substituted by halogen atoms; R" is preferably an alkyl group having 1 to 10 carbon atoms, particularly preferably a methyl, ethyl or propyl radical.

In Formula (I), the radical Y preferably denotes polyurethane radicals and polyoxyalkylene radicals, especially polyoxypropylene-containing polyurethane radicals or polyoxypropylene radicals.

Compounds of Formula (I) can have the groups —[(CR$^1_2$)$_b$—SiR$_a$(OR$^2$)$_{3-a}$]$_x$ bound in the manner described at any desired position in the polymer, such as located at the terminal ends or located in between the terminal ends, i.e. as side groups of the polymer main chain, particularly preferably at the terminal ends of the polymer chain.

The end groups of the compounds according to formula (I) are preferably those of the general Formulae

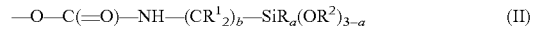
$$—O—C(=O)—NH—(CR^1_2)_b—SiR_a(OR^2)_{3-a} \qquad (II)$$

and

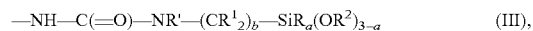
$$—NH—C(=O)—NR'—(CR^1_2)_b—SiR_a(OR^2)_{3-a} \qquad (III),$$

wherein the residues and indices are as above defined.

Particularly, a compound according to Formula (I) may denote silane-terminated polyethers and silane-terminated polyurethanes, in particular silane-terminated polypropylene glycols and silane-terminated polyurethanes each having dimethoxymethylsilyl, trimethoxysilyl, diethoxymethylsilyl or triethoxysilyl end groups bonded via —O—C(=O)—NH—(CR$^1_2$)$_b$- groups or —NH—C(=O)—NR'—(CR$^1_2$)$_b$- groups, wherein R', $R^1$ and b are as defined above.

The average molecular weights $M_n$ of the compounds according to Formula (I) are preferably at least 400 g/mol, particularly preferably at least 600 g/mol, in particular at least 800 g/mol and preferably at most 30 000 g/mol, particularly preferably at most 19 000 g/mol, in particular at most 13 000 g/mol.

The viscosity of compounds according to Formula (I) is preferably at least 0.2 Pas, preferably at least 1 Pas, particularly preferably at least 5 Pas, and preferably at most 1000 Pas, preferably at most 700 Pas, each measured at 20° C.

According to various preferred embodiments, the curable composition to be applied according to step i) of the herein described method may be a composition comprising at least one polymer having at least one silane-functional group of the general formula (IV)

$$—X_o—R^3—Si(R^4)_k(R^5)_{3-k} \qquad (IV),$$

wherein

X is a divalent linking group containing at least one heteroatom;

$R^3$ is selected from divalent hydrocarbon residues having 1 to 12 carbon atoms;

each $R^4$ is, independently of one another, selected from a hydrocarbon radical containing 1 to 20 carbon atoms and each $R^5$ is, independently of one another, selected from a hydroxyl group or a hydrolysable group, wherein $R^4$ and $R^5$ are substituents directly bound with the Si atom or the two of the substituents $R^4$ and $R^5$ form a ring together with the Si atom to which they are bound;

k is 0, 1, or 2; and o is 0 or 1.

In this context, the divalent bonding group (linking group) X comprising at least one heteroatom is understood to be a divalent chemical group which links the polymer backbone of the polymer with the residue $R^3$ of the general formula (IV).

In various embodiments, the divalent linking group X in the general formula (IV) is selected from —O—, —S—, —N(R″)—, —R‴—O—, a substituted or unsubstituted amide, carbamate, urethane, urea, imino, carboxylate, carbamoyl, amidino, carbonate, sulfonate or sulfinate group, wherein R″ is a hydrogen or a linear or branched and substituted or unsubstituted hydrocarbon residue having 1 to 12 carbon atoms; and R‴ is a linear or branched and substituted or unsubstituted hydrocarbon residue having 1 to 12 carbon atoms. The term "substituted" in relation to these groups means that a hydrogen atom present in these groups may be replaced by a non-hydrogen moiety, such as alkyl or aryl groups, preferably $C_{1-12}$ alkyl or $C_{6-14}$ aryl groups.

In preferred embodiments, the linking group X is urethane or urea group, more preferably urethane group. Urethane group can be formed, for example, either when the polymer backbone comprises terminal hydroxy groups and isocyanatosilanes are used as a further component, or conversely when a polymer having terminal isocyanate groups is reacted with an alkoxysilane comprising terminal hydroxy groups. Similarly, urea group can be obtained if a terminal primary or secondary amino group—either on the silane or on the polymer—is used, which reacts with a terminal isocyanate group that is present in the respective reactant. This means that either an aminosilane is reacted with a polymer having terminal isocyanate groups or a polymer that is terminally substituted with an amino group is reacted with an isocyanatosilane. Urethane and urea groups advantageously increase the strength of the polymer chains and of the overall crosslinked polymer.

In preferred embodiments, the linking group X is selected from the group consisting of —O—C(=O)—N(R″)—, —N(R″)—C(=O)O—, —N(R″)—C(=O)—N(R″)—, —N(R″)—C(=O)—, —C(=O)—N(R″)—, —C(=)—O—, —O—C(=O)—, —O—C(=O)—O—, —S—C(=O)—N(R″)—, —N(R″)—C(=O)—S—, —C(=O)—S—, —S—C(=O)—, —S—C(=O)—S—, —C(=O)—, —S—, —O—, —NR″—, and —R‴—O—, wherein R″ and R‴ are as defined above. In more preferred embodiments, the linking group X is selected from —O—C(=O)—N(R″)—, —N(R″)—C(=O)O—, —N(R″)—C(=O)—N(R″)—, —S—, —O—, —N(R″)—, or —R‴—O—, wherein R″ and R‴ are as defined above. In particularly preferred embodiments, the linking group X is selected from —O—C(=O)—N(R″)—, —N(R″)—C(=O)—N(R″)—, —O—, or —R‴—O—, wherein R″ and R‴ are as defined above, more preferably —O—C(=O)—NH— or —NH—C(=O)—NH—, most preferably —O—C(=O)—NH—.

The index "o" corresponds to 0 (zero) or 1, i.e., the linking group X links the polymer backbone with the residue $R^3$ (o=1) or the polymer backbone is bound or linked directly with the residue $R^3$ (o=0). In preferred embodiments, o is 1.

The residue $R^3$ is a divalent hydrocarbon residue having 1 to 12 carbon atoms. The hydrocarbon residue can be a linear, branched or cyclic alkylene residue and can be substituted or unsubstituted. The hydrocarbon residue can be saturated or unsaturated. In preferred embodiments, $R^3$ is a divalent hydrocarbon residue having 1 to 6 carbon atoms. The curing rate of the composition can be influenced by the length of the hydrocarbon residues which form one of the binding links or the binding link between polymer backbone and silyl residue. Particularly preferably, $R^3$ is a methylene, ethylene or n-propylene, in particular a methylene or n-propylene.

Alkoxysilane-functional compounds having a methylene group as binding link to the polymer backbone—so-called "alpha-silanes"—have a particularly high reactivity of the silyl group.

In general, a lengthening of the binding hydrocarbon chain leads to reduced reactivity of the polymers. In particular, "gamma-silanes"—which comprise the unbranched propylene residue as binding link—have a balanced ratio between necessary reactivity (acceptable curing times) and delayed curing (open assembly time, possibility of corrections after bonding).

$R^4$ and $R^5$ are substituents directly bound with the Si atom or the two of the substituents $R^4$ and $R^5$ can form a ring together with the Si atom to which they are bound. In preferred embodiments, $R^4$ and $R^5$ are the substituents directly bound with the Si atom.

Each $R^4$ in the general formula (IV) is, independently of one another, selected from a hydrocarbon radical containing 1 to 20 carbon atoms, preferably $C_1$ to $C_8$ alkyl groups, more preferably a methyl or an ethyl.

Each $R^5$ in the general formula (IV) is, independently of one another, selected from a hydroxyl group or a hydrolysable group, preferably $C_1$ to $C_8$ alkoxy groups, or $C_1$ to $C_8$ acyloxy groups.

In preferred embodiments, Each $R^5$ is, independently of one another, selected from $C_1$ to $C_8$ alkoxy groups, in particular methoxy, ethoxy, i-propyloxy or i-butyloxy group. When k is 0 or 1, combinations of more than one group are also possible. However, acyloxy groups, such as an acetoxy group —O—CO—$CH_3$, can also be used as hydrolyzable groups.

In preferred embodiments, k is 0 or 1.

In particularly preferable embodiments, the silyl group, i.e., —Si$(R^4)_k(R^5)_{3-k}$, is selected from alkyldialkoxysilyl or trialkoxysilyl, preferably selected from methyldimethoxysilyl, ethyldiethoxysilyl, trimethoxysilyl, or triethoxysilyl, most preferably methyldimethoxysilyl or trimethoxysilyl. Alkoxy groups are advantageous, since no substances which irritate mucous membranes are released during the curing of compositions comprising alkoxy groups. The alcohols formed by hydrolysis of the residues are harmless in the quantities released, and evaporate.

In general, polymers comprising di- or trialkoxysilyl groups have highly reactive linking points which permit rapid curing, high degrees of crosslinking and thus good final strengths. The particular advantage of dialkoxysilyl groups lies in the fact that, after curing, the corresponding compositions are more elastic, softer and more flexible than systems comprising trialkoxysilyl groups. They are therefore suitable in particular for use as sealants. In addition, they split off even less alcohol during curing and are therefore of particular interest when the quantity of alcohol released is to be reduced.

With trialkoxysilyl groups, on the other hand, a higher degree of crosslinking can be achieved, which is particularly advantageous if a harder, stronger material is desired after curing. In addition, trialkoxysilyl groups are more reactive and therefore crosslink more rapidly, thus reducing the quantity of catalyst required, and they have advantages in "cold flow"—the dimensional stability of a corresponding adhesive under the influence of force and possibly temperature.

Methoxy and ethoxy groups as comparatively small hydrolyzable groups with low steric bulk are very reactive and thus permit a rapid cure, even with low use of catalyst. They are therefore of particular interest for systems in which rapid curing is desirable, such as for example in adhesives with which high initial adhesion is required.

Interesting configuration possibilities are also opened up by combinations of the two groups. If, for example, methoxy is selected for one of the $R^5$ and ethoxy for the other $R^b$ within the same alkoxysilyl group, the desired reactivity of the silyl groups can be adjusted particularly finely if silyl groups carrying exclusively methoxy groups are deemed too reactive and silyl groups carrying ethoxy groups not reactive enough for the intended use.

In addition to methoxy and ethoxy groups, it is of course also possible to use larger residues as hydrolyzable groups, which by nature exhibit lower reactivity. This is of particular interest if delayed curing is also to be achieved by means of the configuration of the alkoxy groups.

The silane-functional group of the general formula (IV) can be a lateral group within the polymer chain of the respective polymer or a terminal group of the respective polymer. In preferred embodiments, the silane-functional group of the general formula (IV) is a terminal group of the polymer.

In preferred embodiments, the polymer has at least two silane-functional groups of the general formula (IV). In this case, the polymer can have at least one lateral silane-functional group of the general formula (IV) and at least one terminal silane-functional group of the general formula (IV); or, at least two lateral silane-functional groups of the general formula (IV); or, at least two terminal silane-functional groups of the general formula (IV).

In particularly preferred embodiments, the polymer has at least two terminal silane-functional groups of the general formula (IV). Then, each polymer chain comprises at least two linking points at which the condensation of the polymers can be completed, splitting off the hydrolyzed residues in the presence of atmospheric moisture. In this way, regular and rapid crosslinkability is achieved so that bonds with good strengths can be obtained. In addition, by means of the quantity and the structure of the hydrolyzable groups—for example by using di- or trialkoxysilyl groups, methoxy groups or longer residues—the configuration of the network that can be achieved as a long-chain system (thermoplastics), relatively wide-mesh three-dimensional network (elastomers) or highly crosslinked system (thermosets) can be controlled, so that inter alia the elasticity, flexibility and heat resistance of the finished crosslinked compositions can be influenced in this way.

In preferred embodiments, the polymer backbone of the polymer is selected from polyethers, poly(meth)acrylic acid ester, polyesters, polyurethanes, poly-a-olefins, more preferably polyethers or polyurethanes, or copolymers of at least two of said polymers such as polyether and poly(meth) acrylic acid ester copolymers.

A "polyether", "polyoxyalkylene", or "polyalkylene glycol", as used interchangeably herein, is understood to be a polymer in which the organic repeating units comprise ether functionalities C—O—C in the main chain. Examples for such polymers are polypropylene glycol and polyethylene glycol and copolymers thereof. Polymers having lateral ether groups, such as cellulose ethers, starch ethers and vinyl ether polymers, as well as polyacetals such as polyoxymethylene (POM) are not included in the polyethers.

A "poly(meth)acrylic acid ester" is understood to be a polymer based on (meth)acrylic acid esters, which therefore has as a repeating unit the structural motif —CH$_2$—CR' (COOR")—, where R' denotes a hydrogen atom (acrylic acid ester) or a methyl group (methacrylic acid ester) and R" denotes linear alkyl residues, branched alkyl residues, cyclic alkyl residues and/or alkyl residues comprising functional substituents, for example methyl, ethyl, isopropyl, cyclohexyl, 2-ethylhexyl or 2-hydroxyethyl residues.

A "polyurethane" is understood to be a polymer which has at least two urethane groups —NH—CO—O— in the main chain.

In particularly preferred embodiments, the silane-modified polymer has a polyether backbone. Polyethers have a flexible and elastic structure, with which compositions having excellent elastic properties can be produced. Polyethers are not only flexible in their backbone, but at the same time strong. Thus, for example, polyethers are not attacked or decomposed by water and bacteria, in contrast to, e.g., polyesters, for example.

The number average molecular weight $M_n$ of the polyether on which the polymer is based is for preference 500 to 100,000 g/mol (daltons), more preferably 500 to 50,000, particularly preferably 1,000 to 30,000 and in particular 2,000 to 20,000 g/mol, most preferably 8,000 to 20,000 g/mol. Number average molecular weights of at least 500 g/mol are advantageous for the polyethers of the present invention since the corresponding compositions have a balanced ratio of viscosity (ease of processing), strength and elasticity.

Particularly advantageous viscoelastic properties can be achieved if polyethers having a narrow molecular weight distribution, and thus low polydispersity, are used. These can be produced, for example, by so-called double metal cyanide catalysis (DMC catalysis). Polyethers produced in this way are distinguished by a particularly narrow molecular weight distribution, by a high average molecular weight and by a very low number of double bonds at the ends of the polymer chains.

In a special embodiment of the present invention, the maximum polydispersity $M_w/M_n$ of the polyether on which the polymer is based is therefore 2, particularly preferably 1.5 and most particularly preferably 1.3.

The ratio $M_w/M_n$ (polydispersity) indicates the width of the molecular weight distribution and thus of the different degrees of polymerization of the individual chains in polydisperse polymers. For many polymers and polycondensates, a polydispersity value of about 2 applies. Strict monodispersity would exist at a value of 1. A low polydispersity of, for example, less than 1.5 indicates a comparatively narrow molecular weight distribution, and thus the specific expression of properties associated with molecular weight, such as e.g., viscosity. In particular, therefore, in the context of the present invention, the polyether on which the polymer C is based has a polydispersity ($M_w/M_n$) of less than 1.3.

In particularly preferred embodiments, the polymer having at least one silane-functional group of the general formula (IV) can be obtained by reacting at least one polyol and at least one isocyanatosilane. If necessary, the polyol(s) can be first reacted with at least one polyisocyanate for chain extension.

In certain embodiments, the polymer having at least one silane-functional group of the general formula (IV) can be obtained by reacting at least one polyol with a stoichiometric excess of at least one polyisocyanate; and reacting the obtained NCO-terminated polyurethane prepolymer with at least one aminosilane, such as 3-aminopropyltrimethoxysilane.

A "polyol" is understood to be a compound which contains at least two OH groups, irrespective or whether the compound contains other functional groups. However, a polyol used in accordance with the present invention preferably contains only OH groups as functional groups or, if other functional groups are present, none of these other functional groups is reactive at least to isocyanates under the conditions prevailing during the reaction of the polyol(s) and isocyanatosilane(s) or polyisocyante(s).

The polyols suitable for preparing said silane-terminated polymer are preferably polyether polyol. The above descriptions about the molecular weight and polydispersity of the polyether apply to the polyether polyol. The polyether polyol is preferably a polyalkylene oxide, particularly preferably polyethylene oxide and/or polypropylene oxide. In preferred embodiments, a polyether or a mixture of two polyethers are used.

The polyols to be used in accordance with the invention have an OH value of preferably about 1 to about 250.

Besides the polyethers, the polyol mixture may contain other polyols. For example, it may contain polyester polyols with a molecular weight of about 200 to about 30,000.

The isocyanatosilane used in the above reaction is understood to have the general formula of $OCN-R^3-Si(R^4)_k(R^5)_{3-k}$, wherein $R^3$, $R^4$, $R^5$, and k are as defined for the general formula (IV).

A "polyisocyanate" is understood to be a compound which has at least two isocyanate groups —NCO. This compound does not have to be a polymer, and instead is frequently a low molecular compound.

The polyisocyanates suitable for preparing the polyurethane according to the invention include ethylene diisocyanate, 1,4-tetramethylene diisocyanate, 1,4-tetramethoxybutane diisocyanate, 1,6-hexamethylene diisocyanate (HDI), cyclobutane-1,3-diisocyanate, cyclohexane-1,3- and -1,4-diisocyanate, bis(2-isocyanatoethyl)fumarate, 1-isocyanato-3,3,5-trimethyl-5-isocyanatomethylcyclohexane (isophorone diisocyanate, IPDI), 2,4- and 2,6-hexahydrotoluylene diisocyanate, hexahydro-1,3- or -1,4-phenylene diisocyanate, benzidine diisocyanate, naphthalene-1,5-diisocyanate, 1,6-diisocyanato-2,2,4-trimethylhexane, 1,6-diisocyanato-2,4,4-trimethylhexane, xylylene diisocyanate (XDI), tetramethylxylylene diisocyanate (TMXDI), 1,3- and 1,4-phenylene diisocyanate, 2,4- or 2,6-toluylene diisocyanate (TDI), 2,4'-diphenylmethane diisocyanate, 2,2'-diphenylmethane diisocyanate, or 4,4'-diphenylmethane diisocyanate (MDI), and the isomeric mixtures thereof. Also suitable are partially or completely hydrogenated cycloalkyl derivatives of MDI, for example completely hydrogenated MDI ($H_{12}$-MDI), alkyl-substituted diphenylmethane diisocyanates, for example mono-, di-, tri-, or tetraalkyldiphenylmethane diisocyanate and the partially or completely hydrogenated cycloalkyl derivatives thereof, 4,4'-diisocyanatophenylperfluorethane, phthalic acid-bis-isocyanatoethyl ester, 1 chloromethylphenyl-2,4- or -2,6-diisocyanate, 1-bromomethylphenyl-2,4- or -2,6-diisocyanate, 3,3'-bis-chloromethyl ether-4,4'-diphenyl diisocyanate, sulfur-containing diisocyanates such as those obtainable by reacting 2 moles diisocyanate with 1 mole thiodiglycol or dihydroxydihexyl sulfide, diisocyanates of dimer fatty acids, or mixtures of two or more of the named diisocyanates. The polyisocyanate is preferably IPDI, TDI or MDI.

Other polyisocyanates suitable for use in accordance with the invention are isocyanates with a functionality of three or more obtainable, for example, by oligomerization of diisocyanates, more particularly by oligomerization of the isocyanates mentioned above. Examples of such tri- and higher isocyanates are the triisocyanurates of HDI or IPDI or mixtures thereof or mixed triisocyanurates thereof and polyphenyl methylene polyisocyanate obtainable by phosgenation of aniline/formaldehyde condensates.

The silane-modified polymers discussed above are commercially available products or can be synthesized using known methods and processes, such as addition reactions, e.g. hydrosilylation, Michael addition, Diels-Alder addition or reactions between isocyanate-functional compounds with compounds containing isocyanate-active groups. In this regard, reference may be made to, for instance EP1535940B1 and EP1896523B1. Alternative synthetic routes are further disclosed in WO 2013/026654 A1.

MS polymers suitable for employment in the context of the present invention include, without limitation, polymers and prepolymers commercially available under the brand name GENIOSIL®, specific examples suitable for employment according to the present invention are the α-silane polyether type prepolymers GENIOSIL® STPE-E10, -E15, -E30 and -E35; the α-silane polyether-polyurethane type prepolymers of the GENIOSIL® XB series, an example of which is GENIOSIL® XB 502; GENIOSIL® XT; GENIOSIL® XM; and GENIOSIL® WP. Moreover, examples of curable polypropylene oxide resins include various known reactive polypropylene oxide resins, such as Kaneka MS polymer available from Kaneka Corporation.

The amount of one or more MS prepolymers, i.e. one type of MS prepolymer or different kinds of MS prepolymers, i.e. two or more different kinds of MS prepolymers, as herein defined above, in a curable composition to be applied according to step i) of the herein defined method is typically in the range of about 10 to about 95 wt.-%, preferably in the range of about 10 to about 90 wt.-%, even more preferably in the range of about 15 to about 85 wt.-%, for instance about 15, 16, 17, 18, 19, 20, 21, 22, 23, 24, 25, 26, 27, 28, 29, 30,31, 32, 33, 34, 35, 36, 37, 38, 39, 40, 45, 50, 55, 60, 65, 70, 75, 80 or 85 wt.-%, based on the total weight of the curable composition.

In the context of the aforementioned MS polymer type resin compositions, it will be readily recognized that, in addition to generally fast curing rates, a prominent advantage of α-silane type curable resin compositions is that neither tin catalysts nor strong acids or bases need be included for curing purposes. Thus, according to various documents, the at least one curable composition applied in step i) of the herein described method is an α-silane type curable resin composition, i.e. is curable resin composition comprising at least one α-silane type prepolymer, as herein defined above, preferably in amounts of about 10 to about 95 wt.-%, more preferably about 10 to about 90 wt.-%, such as about 10, 11, 12, 13, 14, 15, 16, 17, 18, 19, 20, 25, 30, 35, 40, 45, 50, 55, 60, 65, 70, 75, 80, 85 or 90 wt.-%, based on the total weight of the respective curable composition.

A typical curable MS type composition further comprises, in addition to the aforementioned MS type polymer component, further ingredients generally known in the art for the purpose of inclusion in curable, particularly moisture curable compositions. A non-exhaustive list of further ingredients to be optionally included comprises further reactive silane or siloxane compounds, fillers, catalysts, adhesion promotors, water scavengers, reactive and non-reactive diluents, solvents, plasticizers, rheology modifiers, preservatives, UV stabilizers, pigments and colorants.

Suitable MS type polymer compositions can be used both in pure form and in the form of a solution or emulsion.

Suitable solvents may be selected from ethers (e.g. diethyl ether, methyl-t-butyl ether, ether derivatives of glycol, THF), esters (e.g. ethyl acetate, butyl acetate, glycol ester), hydrocarbons (e.g. (e.g. pentane, cyclopentane, hexane, cyclohexane, heptane, octane or also longer-chained branched and unbranched alkanes), ketones (e.g. acetone, methyl ethyl ketone), aromatics (e.g. acetone, methyl ethyl ketone), aromatics (e.g. ethyl acetate, butyl acetate, glycol esters) (e.g. toluene, xylene, ethylbenzene, chlorobenzene) and alcohols (e.g. methanol, ethanol, glycol, propanol, isopropanol, glycerine, butanol, iso-butanol, t-butanol).

However, MS polymer compositions that are free of organic solvents may be preferred due to ecological and/or health concerns. In various embodiments, the curable composition, preferably the curable MS type compositions, are thus substantially free of organic solvent.

In the context of the present invention, the term "substantially free" refers to compositions comprising less than about 1 wt.-%, preferably less than about 0.5 wt.-%, more preferably less than about 0.1 wt.% of the respective ingredient. For instance, a composition substantially free of organic solvent comprises, in the context of the present invention, less than about 1 wt.-% organic solvent.

As non-limiting examples of commercially available curable compositions of the MS polymer type, as herein defined above, Teroson® MS 647 2C, Teroson® MS 930, Teroson® MS 931, Teroson® MS 9320 SF, and Teroson® MS 9371 B, all available from Henkel, may be mentioned.

Curable compositions as herein defined above may used alone or in combination of two or more.

Another type of curable composition, particularly moisture curable composition is the silicone resin type curable composition, particularly moisture curable silicon resin compositions. Both 1K and 2K silicon resin type curable compositions are generally known in the art, both of which may find application in the context of the present invention. Non-limiting examples of silicon resin type curable compositions are silicon resin compositions comprising at least one compound containing units of the following Formula (V)

wherein, in Formula (V)
$R^6$ is independently selected from hydrogen, a monovalent, SiC-bonded, optionally substituted aliphatic hydrocarbon radical or a divalent, optionally substituted aliphatic hydrocarbon radical, which bridges two units of the formula (V)
$R^7$ is independently selected from hydrogen or a monovalent, optionally substituted hydrocarbon radical,
$R^8$ is independently selected from a monovalent, SiC-bound, optionally substituted aromatic hydrocarbon residue,
c is 0, 1, 2 or 3,
d is 0, 1, 2 or 3, preferably 0, 1 or 2, particularly preferably 0 or 1, and
e is 0, 1 or 2, preferably 0 or 1,
with the proviso that the sum of c+d+e is less than or equal to 3. In certain embodiments, in at least 40% of the units of formula (V) the sum c+e is equal to 0 or 1.

In preferred embodiments, a compound containing units of Formula (V) contains units of Formula (V) in amounts of about 80 wt.-%, preferably about 85, more preferably at least about 90 wt.-%. Even more preferably, a compound containing units of Formula (V) consists of units of Formula (V).

Examples of radicals R are alkyl radicals, such as the methyl, ethyl, n-propyl, iso-propyl, 1-n-butyl, 2-n-butyl, iso-butyl, tert.-pentyl radical; hexyl radicals, such as the n-hexyl radical; heptyl radicals, such as the n-heptyl radical; octyl radicals, such as the n-octyl radical, iso-octyl radicals and the 2,2,-trimethylpentyl radical; nonyl radicals, such as the n-nonyl radical; decyl radicals, such as the n-decyl radical; dodecyl radicals, such as the n-dodecyl radical; octadecyl radicals, such as the n-octadecyl radical; cycloalkyl radicals, such as cyclopentyl, cyclohexyl, cycloheptyl and methylcyclohexyl radicals; alkenyl radicals, such as vinyl, 1-propenyl and 2-propenyl radicals; aryl radicals, such as the phenyl, 2-propenyl and 2-propenyl radicals; and phenyl-, naphthyl, anthryl and phenanthryl radicals; alkaryl radicals, such as o-, m-, p-tolyl radicals, xylyl radicals and ethylphenyl radicals; and aralkyl radicals, such as the benzyl radical, the a~ and the β-phenylethyl radical.

Examples of substituted radicals R are haloalkyl radicals such as the 3,3,3-trifluoro-n-propyl radical, the 2,2,2,2',2', 2',2'-hexafluoroisopropyl radical and the heptafluoroxsopropyl radical, and haloaryl radicals such as the o-, m-, and p-chlorophenyl radicals. The R radical is preferably a monovalent hydrocarbon radical having 1 to 6 carbon atoms which is optionally substituted by halogen atoms, particularly preferably an alkyl radical having 1 or 2 carbon atoms, in particular methyl radical.

Examples of residues $R^6$ are the aliphatic examples given above for R. However, $R^6$ can also be a divalent aliphatic radical, which links two silyl groups of formula (V), such as alkylene radicals having 1 to 10 carbon atoms, such as methylene, ethylene, propylene or butylene radicals. A particularly common example of a divalent aliphatic radical is the ethylene radical. However, the radical $R^6$ is preferably a monovalent SiC-bonded aliphatic hydrocarbon radical with 1 to 18 carbon atoms, which may be substituted with halogen atoms, particularly preferably aliphatic hydrocarbon radicals with 1 to 6 carbon atoms, especially the ethyl radical.

Examples for residue $R^7$ are hydrogen tom or the examples given for residue R. Preferably, the $R^7$ radical is a hydrogen atom or an alkyl radical with 1 to 10 carbon atoms that is optionally substituted with halogen atoms, particularly preferably an alkyl radical with 1 to 4 carbon atoms, especially the methyl and ethyl radical.

Examples of radicals $R^8$ are the aromatic radicals indicated above for R. Particularly, the $R^8$ radicals are SiC-bonded aromatic hydrocarbon radicals with 1 to 18 carbon atoms, optionally substituted with halogen atoms, such as ethylphenyl, tolyl, xylyl, chlorophenyl, naphthyl or styryl radicals, particularly preferably the phenyl radical.

Preferred are silicone resins in which at least 90% of all $R^6$ radicals are methyl radicals, at least 90% of all $R^7$ radicals are methyl, ethyl, propyl or isopropyl radicals and at least 90% of all $R^8$ radicals are phenyl radicals.

Particularly, silicone resins may be used, which have at least 20%, particularly preferably at least 40%, of units of the formula (V) in which c is equal to 0, in each case based on the total number of units of the formula (V).

Further, silicone resins may be used, which, in each case based on the total number of units of the formula (V), have at least 10%, particularly preferably at least 20%, and at most 80%, particularly preferably at most 60%, of units of the formula (V) in which c is 2.

Silicone resins are preferably used which, in each case based on the total number of units of the formula (V), contain at least 80%, particularly preferably at least 95%, of units of the formula (V) in which d is 1 or 0.

Further preferred silicone resins are those, which, in each case based on the total number of units of the formula (V), contain at least 60%, particularly preferably at least 70%, preferably at most 99%, particularly preferably at most 97%, of units of the formula (V), in which d is 0.

Further preferred examples of silicone resins are those, which, in each case based on the total number of units of the formula (V), have at least 1%, preferably at least 10%, in particular at least 20%, of units of the formula (V), in which e is not equal to 0. Furthermore, silicone resins may be used, which exclusively contain units of the formula (V), in which e is not equal to 0, but particularly preferably at least 10%, particularly preferably at least 20%, preferably at most 80%, particularly preferably at most 60%, of the units of the formula (V) have e equal 0.

Further examples of the above defined silicone resins are those, which, in each case based on the total number of units of the formula (V), have at least 20%, particularly preferably at least 40%, of units of the formula (V), in which e is 1. Silicone resins may be used, which exclusively comprise units of the formula (V), in which e equals 1, but particularly preferably at least 10%, particularly preferably at least 20%, preferably at most 80%, particularly preferably at most 60%, of the units of the formula (V) have e equal 0.

Further examples of silicone resins are those, which, based on the total number of units of formula (V), have at least 50% of units of formula (V), in which the sum of c+e is 0 or 1.

Further examples of the above defined silicone resins are those, which, in each case based on the total number of units of the formula (V), have at least 20%, particularly preferably at least 40%, of units of the formula (V), in which e is 1 and c is 0. Preferably, at most 70%, particularly preferably at most 40% of all units of formula (V) have d not equal 0.

Furthermore, those silicone resins may be advantageously used, which, in each case based on the total number of units of the formula (V), have at least 20%, particularly preferably at least 40%, of units of the formula (V), in which e denotes and c equals 0, and which additionally have at least 1%, preferably at least 10%, of units of the formula (V), wherein c denotes 1 or 2, preferably 2, and e equals 0. Particularly at most 70%, more particularly preferably at most 40% of all units of formula (V) have d not equal 0 and at least 1% of all units of formula (V) have d equal 0.

Examples of the above described silicone resins are organopolysiloxane resins consisting essentially, preferably exclusively, of (Q) units of the formulae $SiO_{4/2}$, $Si(OR^9)O_{3/2}$, $Si(OR^9)_2O_{2/2}$ and $Si(OR^9)_3O_{1/2}$; (T) units of the formulae $PhSiO_{3/2}$, $PhSi(OR^9)O_{2/2}$ and $PhSi(OR^9)_2O_{1/2}$; (D) units of the formulae $Me_2SiO_{2/2}$ and $Me_2Si(OR^9)O_{1/2}$; and (M) units of the formula $Me_3SiO_{1/2}$, wherein Me is a methyl radical, Ph represents a phenyl radical and $R^9$ represents hydrogen atoms or alkyl radicals having from 1 to 10 carbon atoms, optionally substituted by halogen atoms, particularly preferably hydrogen atoms or alkyl radicals having from 1 to 4 carbon atoms, the resin containing, per mole of (T) units, preferably 0-2 moles of (Q) units, 0-2 moles of (D) units and 0-2 moles of (M) units.

Further examples of the silicone resins as described above are organopolysiloxane resins consisting essentially, preferably exclusively, of T units of the formulae $PhSiO_{3/2}$, PhSi(OR9)O2/2 and $PhSi(OR^9)_2O_{1/2}$ as well as D units of the formulae $Me_2SiO_{2/2}$ and $Me_2Si(OR^9)O_{1/2}$, wherein Me is a methyl radical, Ph is a phenyl radical and $R^9$ denotes a hydrogen atom or alkyl radicals having from 1 to 10 carbon atoms, optionally substituted by halogen atoms, particularly preferably hydrogen atom or alkyl radicals having from 1 to 4 carbon atoms, with a molar ratio of (T) to (D) units of from 0.5 to 2.0.

Further examples of the above defined silicone resins are organopolysiloxane resins consisting essentially, preferably exclusively, of T units of the formulae $PhSiO_{3/2}$, $PhSi(OR^9)O_{2/2}$ and $PhSi(OR^9)_2O_{1/2}$ as well as T units of the formulae $MeSiO_{3/2}$, $MeSi(OR^9)O_{2/2}$ and $MeSi(OR^9)_2O_{1/2}$ as well as optionally D units of the formulae $Me_2SiO_{2/2}$ and $Me_2Si(OR^9)O_{1/2}$, wherein Me is a methyl radical, Ph is a phenyl radical and $R^9$ denotes a hydrogen atom or alkyl radicals having 1 to 10 carbon atoms, which are optionally substituted by halogen atoms, particularly preferably hydrogen atom or alkyl radicals having 1 to 4 carbon atoms, with a molar ratio of phenyl silicone to methyl silicone units of 0.5 to 4.0. The content of D units in these silicone resins is preferably less than 10% by weight.

Further examples of the above defined silicone resins are organopolysiloxane resins consisting essentially, preferably exclusively, of T units of the formulae $PhSiO_{3/2}$, $PhSi(OR^9)O_{2/2}$ and $PhSi(OR^9)_2O_{1/2}$, where Ph is a phenyl radical and $R^9$ denotes a hydrogen atom or optionally halogen-substituted alkyl radicals having 1 to 10 carbon atoms, particularly preferably a hydrogen atom or alkyl radicals having 1 to 4 carbon atoms. The content of D-units in these silicone resins is preferably less than 10% by weight.

Suitable silicone resins may have an average molar mass (number average) $M_n$ of at least 400 g/mol and, particularly preferably, of at least 600 g/mol. The mean molar mass $M_n$ is preferably at most 400,000 g/mol, particularly preferably at most 100,000 g/mol, and in particular at most 50,000 g/mol.

Suitable silicone resins can be either solid or liquid at 23° C. and 1000 hPa, while preferred silicone resins are liquid. Preferred viscosities lie in the range of about 10 to 100,000 mPas, preferably 50 to 50,000 mPas, in particular 100 to 2,000 mPas. Suitable silicone resins may have a polydispersity ($M_w/M_n$) of maximum 5, preferably of maximum 3.

Suitable silicone resins can be used both in pure form and in the form of a solution or emulsion.

Suitable solvents may be selected from ethers (e.g. diethyl ether, methyl-t-butyl ether, ether derivatives of glycol, THF), esters (e.g. ethyl acetate, butyl acetate, glycol ester), hydrocarbons (e.g. (e.g. pentane, cyclopentane, hexane, cyclohexane, heptane, octane or also longer-chained branched and unbranched alkanes), ketones (e.g. acetone, methyl ethyl ketone), aromatics (e.g. acetone, methyl ethyl ketone), aromatics (e.g. ethyl acetate, butyl acetate, glycol esters) (e.g. toluene, xylene, ethylbenzene, chlorobenzene) and alcohols (e.g. methanol, ethanol, glycol, propanol, isopropanol, glycerine, butanol, iso-butanol, t-butanol).

However, silicone resins that are free of organic solvents may be preferred due to ecological and/or health concerns.

The above-described silicone resins are commercially available products, but can also be produced by methods commonly used in silicon chemistry. Suitable for employment in the context of the present invention are, for instance but without limitation, silicon resin products commercially available under the brand name SILRES® by Wacker, examples of which include liquid resin types such as SILRES® REN 50, 60, 70-M, and 80, SILRES® KX, SILRES® HK46, and SILRES® MSE 100; emulsion type resins such as SILRES® MP 50 E and SILRES® MPF 52 E; organofunctional polysiloxanes such as SILRES® HP 2000; and further intermediates such as SILRES® SY 300 or SILRES® IC232; and solids such as SILRES® 603 and SILRES® 604.

The amount of one or more silicon resins, i.e. one type of silicon resin or different kinds of silicon resin, i.e. two or more different kinds of silicon resin, as herein defined above, in a curable composition to be applied according to step i) of the herein defined method is typically in the range of about 10 to about 95 wt.-%, preferably in the range of about 10 to about 90 wt.-%, even more preferably in the range of about 15 to about 85 wt.-%, for instance about 15, 16, 17, 18, 19, 20, 21, 22, 23, 24, 25, 26, 27, 28, 29, 30, 31, 32, 33, 34, 35, 36, 37, 38, 39, 40, 45, 50, 55, 60, 65, 70, 75, 80 or 85 wt.-%, based on the total weight of the curable composition.

A typical curable silicon resin type composition further comprises, in addition to the aforementioned silicon resin component, further ingredients generally known in the art for the purpose of inclusion in such curable, particularly moisture curable compositions. A non-exhaustive list of further ingredients to be optionally included comprises reactive silane or siloxane compounds, fillers, catalysts, adhesion promotors, water scavengers, reactive and non-reactive diluents, solvents, plasticizers, rheology modifiers, preservatives, UV stabilizers, pigments and colorants.

As non-limiting examples of commercially available curable compositions of the silicon resin type, Loctite® SI products, examples of which include Loctite® SI 5611 and Loctite® SI 5710, as well as omniVlSC® 1050, all available from Henkel, may be mentioned.

It may be noted that also such moisture curable compositions comprising both an MS prepolymer component and a silicon resin component may be advantageously applied in the context of the present invention.

According to various embodiments, the at least one curable composition characterized in that the at least one curable composition comprises at least one compound of Formula (I)

wherein, in Formula (I),
Y denotes an x-valent polymer radical bonded via nitrogen, oxygen, sulfur or carbon,
R is independently selected from a monovalent, optionally substituted, SiC-bonded hydrocarbon radical,
$R^1$ is independently selected from hydrogen or a monovalent, optionally substituted hydrocarbon radical which may be attached to the carbon atom via nitrogen, phosphorus, oxygen, sulfur or carbonyl group,
$R^2$ is independently selected from hydrogen or a monovalent, optionally substituted hydrocarbon radical,
x is an integer from 1 to 10, preferably 1, 2 or 3, especially preferably 1 or 2
a is independently selected from 0, 1 and 2, preferably 0 and 1, and
b is independently selected from an integer from 1 to 10, preferably 1, 3 and 4, particularly preferably 1 and 3, in particular 1;
and/or
at least one compound containing units of the following Formula (V)

wherein, in Formula (V)
$R^6$ is independently selected from hydrogen, a monovalent, SiC-bonded, optionally substituted aliphatic hydrocarbon radical or a divalent, optionally substituted aliphatic hydrocarbon radical, which bridges two units of the formula (V)
$R^7$ is independently selected from hydrogen or a monovalent, optionally substituted hydrocarbon radical,
$R^8$ is independently selected from a monovalent, SiC-bound, optionally substituted aromatic hydrocarbon residue,
c is 0, 1, 2 or 3,
d is 0, 1, 2 or 3, preferably 0, 1 or 2, particularly preferably 0 or 1, and
e is 0, 1 or 2, preferably 0 or 1,
with the proviso that the sum of c+d+e is less than or equal to 3. In certain embodiments, in at least 40% of the units of formula (V) the sum c+e is equal to 0 or 1.

In various embodiments, the at least one curable composition comprises at least one compound of Formula (I) defined above.

In various embodiments, the at least one curable composition, as herein described above, does not comprise an epoxy component. In various embodiments, the curable composition is substantially free of epoxy components.

In various embodiments, the at least one curable composition, as herein described above, does not comprise a photo-curable polymer component. In various embodiments, the curable composition is substantially free of photo-curable components.

In various embodiments of the present invention, step i) of the herein described method may comprise the application of one curable composition, particularly a moisture curable composition, such as an MS polymer type or silicon resin type curable composition, as herein described above. However, step i) may also comprise the application of two or more curable compositions, particularly moisture curable compositions, such as MS polymer type or silicon resin type curable compositions. In various embodiments, at least one MS polymer type moisture curable composition and at least one silicon resin type moisture curable composition may be used in combination in step i) of the herein described method. Moreover, the application of at least one curable composition, as herein defined, may be performed once or may be repeated several times in step i) so as to achieve a desired thickness and/or sufficient spread thereof on the outer surface of the solar panel backside, as well as sufficient coverage of any damaged part or site of said solar panel backside and/or sufficient filling of damages such as cracks, chips, fissures and the like in the outer surface of said solar panel backside.

According to various embodiments, the thickness of a thusly applied layer of one or more curable compositions, as herein defined above, may lie in the range of about 0.1 mm to about 1 cm, preferably in the range of about 0.1 mm to about 0.5 cm, even more preferably in the range of about 0.1 mm to about 0.1 cm, particularly in the range of about 0.1 mm to about 5 mm, most preferably in the range of about 0.1 to about 0.3 mm, and may thus have a thickness of, for instance but without limitation, 0.1, 0.2, 0.3, 0.4, 0.5, 0.6, 0.7, 0.8, 0.9, 1.0, 1.5, 2.0, 2.5, 3.0, 3.5, 4.0, 4.5 or 5.0 mm, most preferably about 0.1, 0.15, 0.2, 0.25 or 0.3 mm.

As already detailed above, a curable composition to be applied according to step i) of the herein described method may be in the form of a 1K or 2K composition. This pertains to both the above-described MS type and silicon resin type curable composition. Generally, one-component compositions are storage stable in the absence of water and may generally be cured at room temperature upon contact with water, such as humidity. However, curable compositions suitable for employment according to the present invention may also be used in the form of 2K compositions, wherein, in the case of moisture curable compositions, OH-containing compounds such as water are included as part of a second component to be added to a first component containing the reactive polymer component(s).

The curing of the thusly applied one or more curable compositions, as herein described above, is realized in step ii) of the method of the present invention. However, as the curing of a 2K curable composition occurs as soon as the two components of come into contact with each other, curing of a 2K composition applied in step i) of the herein described method is at least partly effectuated in step i) already. Thus, step ii) of a method according to the present invention comprising the application of a 2K curable composition, such as a 2K moisture curable composition, may be regarded as the step of completing the curing of said composition and may comprise, according to various embodiments, exposure of the applied composition to heat and or radiation, such as IR radiation, particularly heat, i.e. elevated temperatures in the range of about 25 to about 150° C., such as about 30, 40, 50, 60, 70, 80, 90, 100, 110, 120, 130, 140 or 150° C., for instance in the case of moisture curable 2K compositions of the silicone type. In the case of a 1K composition applied in step i) of the herein described method, curing will occur as soon as said composition comes into contact with an appropriate effector, such as hydroxyl group containing compounds in the case of moisture curable 1K compositions. Thus, in the case of 1K moisture curable compositions applied according to step i) of the herein described method, curing occurs upon contact with ambient air, at room temperatures or at elevated temperatures. In some embodiments, step ii) of the herein described method is performed without exposure of the one or more applied curable compositions, as herein described and defined, to heat or radiation, such as IR radiation.

The curable composition applied according to step i) may be kept under conditions that promote curing thereof, as herein described above, for an amount of time sufficient so as to allow for sufficient and thorough curing thereof. Said amount of time necessary depends on curing rates and curing conditions and may generally lie in the range of about 1 minute to about 1 week, more preferably in the range of about 5 minutes to about 5 days, such as about 5, 10, 20, 30, 45 or 60 minutes, 2 hours, 6 hours, 12 hours, 24 hours, 2 days, 3 days, 4 days or 5 days.

According to various embodiments, the herein described method further comprises a step ai) of applying at least one curable composition that is different from the at least one curable composition applied in step i) prior to step i) and curing said curable composition applied prior to step i) prior to step i), said curable composition applied and cured prior to step i) being a curable epoxy resin composition. As herein described above, any cleaning of the solar panel backside may be advantageously performed prior to application of any curable composition in accordance with the presently described method, including the at least one curable epoxy type resin formulation to be optionally applied according to step ai). Curable epoxy resin suitable for employment in the context of the present invention may be 1K or 2K curable epoxy compositions and include those commercially available under the brand names Loctite® EA available from Henkel, a non-limiting Example of which is Loctite® EA 9535. Application of said at least one curable epoxy type resin composition may be realized as detailed above in the context of step i) and may include dilution with a suitable solvent or diluting agent to obtain a desirable viscosity. Curing conditions, of course, depend on the exact type of epoxy resin used and may be selected and adapted, insofar necessary, accordingly. Application of a curable epoxy type resin composition according to step ai), as herein described, in addition to application of a curable composition according to step i), as herein described, may result in an improved optical appearance of a thusly repaired solar panel backside and/or improved adhesion of the curable composition applied according to step i) and cured, as herein defined and described, and/or improved protection of the repaired solar panel backside against environmental influences.

In various embodiments, the method of the present invention preferably does not comprise application of one or more covering layers on top of the at least one curable composition applied in step i), be it before or after curing according to step ii). Particularly, the method of the present invention does not require and therefore does not comprise application of a polyester layer, a polyamide layer, a polyolefin layer, and/or a fluoropolymer layer.

Generally, both color and level of transparency of any curable composition applied according to the herein described method may be chosen and, insofar necessary, modified and adapted so as to result in an optically pleasing and appealing repaired solar panel backside. For instance, in cases where the outer surface of a solar panel backside is of white color, it may be desirable to select one or more curable compositions, as herein described and defined, to be applied in accordance with the herein described method to be of a similar or identical color to match the color of the outer surface of the solar panel backside, i.e. to have a similar or identical white hue, or to be as transparent as possible, so as to be as inconspicuous as possible or wished for.

The method of the present invention offers many advantages over state-of-the-art repair methods. The curable compositions described herein do not require additional priming and/or protective layers. They are easy to apply in being suitable for application via spray gun, resulting in thin, elastic coatings with excellent adhesion on the substrate that are crack-resistant and adequately and thoroughly fill existing cracks on the solar panel backside. Particularly in the case of 1K composition, no mixing of reagents is required, and humidity cure is ecologically and economically advantageous in requiring neither light nor heat. The absence of harmful components like epoxy components further adds to the list of benefits in making the method of the present invention overall less harmful to human health. No expensive coating equipment is required; application can be realized location-independent and electricity-free.

Upon curing, a repaired solar panel backside, i.e., repaired solar panel backboard, may be obtained.

In a further aspect, the present invention also relates to the use of a curable composition for the repairing of a solar panel backside comprising at least one site in need of repair, as herein defined and described.

It is understood that all embodiments disclosed herein in relation to the methods, products and uses are similarly applicable to articles formed therefrom/thereby, insofar applicable, and vice versa.

Accordingly, in a further aspect, the present invention also relates to a repaired solar panel backside obtainable in a method as herein described and defined.

Many modifications and other embodiments of the inventions set forth herein will come to mind to one skilled in the art to which these inventions pertain having the benefit of the teachings presented in the foregoing descriptions. Therefore, it is to be understood that the inventions are not to be limited to the specific embodiments disclosed and that modifications and other embodiments are intended to be included within the scope of the appended claims. Moreover, although the foregoing descriptions describe some example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method of repairing a solar panel backside, the method comprising the steps of:
   a) applying at least one curable composition comprising
      (i) at least one compound of formula (1)

      $$Y-[(CR^1_2)_b-SiR_a(OR^2)_{3-a}]_x \quad (I)$$

wherein, in Formula (I),
      Y denotes an x-valent polymer radical bonded via nitrogen, oxygen, sulfur or carbon,
      R is independently selected from a monovalent, optionally substituted, SiC-bonded hydrocarbon radical,
      $R^1$ is independently selected from hydrogen or a monovalent, optionally substituted hydrocarbon radical which may be attached to the carbon atom via nitrogen, phosphorus, oxygen, sulfur or carbonyl group,
      $R^2$ is independently selected from hydrogen or a monovalent, optionally substituted hydrocarbon radical,
      x is an integer from 1 to 10,
      a is independently selected from 0, 1 and 2, and
      b is independently selected from an integer from 1 to 10; and
      (ii) at least one compound containing units of formula (V)

      $$R^6_c(R^7O)_d R^8_e SiO_{(4-c-d-e)/2} \quad (V)$$

wherein, in Formula (V)
      $R^6$ is independently selected from hydrogen, a monovalent, SiC-bonded, optionally substituted aliphatic hydrocarbon radical or a divalent, optionally substituted aliphatic hydrocarbon radical, which bridges two units of the formula (V),
      $R^7$ is independently selected from hydrogen or a monovalent, optionally substituted hydrocarbon radical,
      $R^8$ is independently selected from a monovalent, SiC-bound, optionally substituted aromatic hydrocarbon residue,
      c is 0, 1,2 or 3,
      d is 0, 1, 2 or 3, and
      e is 0, 1 or 2, with the proviso that the sum of c+d+e is less than or equal to 3,
      onto at least part of the solar panel backside which includes at least one site in need of repairing, wherein the at least one side in need of repairing is selected from one or more of a blistering, a crack, a micro-crack, a scratch, a fissure, a hole, a rupture, a tear and a chink in the solar panel backside; and
   b) curing said curable composition to obtain a repaired solar panel backside, wherein the at least one curable composition is a moisture curable composition.

2. The method according to claim 1, wherein the method comprises a further step of cleaning at least part of the solar panel backside prior to applying the curable composition.

3. The method according to claim 1, wherein the curable composition is selected from the group consisting of a curable modified silane resin composition, a curable silicone resin composition and combinations thereof.

4. The method according to claim 1, wherein the at least one curable composition is a one-component (1K) or a two-component (2K) curable composition.

5. The method according to claim 1, wherein in at least 40% of the units of formula (V) the sum c+e is equal to 0 or 1.

6. A solar panel comprising the moisture curable composition of claim 1 disposed on the backside thereof.

7. A solar panel comprising cured reaction products of the moisture curable composition of claim 1 on the backside thereof.

8. A repaired solar panel backside obtainable in a method according to 1.

9. The method according to claim 1, wherein the curing of said curable composition occurs upon contact with ambient air.

10. The method according to claim 1, wherein the curing of said curable composition occurs at room temperature.

11. The method according to claim 1, wherein the curing of said curable composition is performed without exposure of said curable composition to heat.

12. The method according to claim 1, wherein the curing of said curable composition is performed without exposure of said curable composition to radiation.

* * * * *